United States Patent
De Vleeschouwer et al.

(10) Patent No.: US 12,068,408 B2
(45) Date of Patent: Aug. 20, 2024

(54) HIGH ELECTRON MOBILITY TRANSISTOR

(71) Applicant: SEMICONDUCTOR COMPONENTS INDUSTRIES, LLC, Phoenix, AZ (US)

(72) Inventors: Herbert De Vleeschouwer, Zulte (BE); Jaume Roig-Guitart, Oudenaarde (BE); Peter Moens, Erwetegem (BE); Mohammad Shawkat Zaman, North York (CA); Olivier Trescases, Toronto (CA)

(73) Assignee: SEMICONDUCTOR COMPONENTS INDUSTRIES, LLC, Scottsdale, AZ (US)

(*) Notice: Subject to any disclaimer, the term of this patent is extended or adjusted under 35 U.S.C. 154(b) by 312 days.

(21) Appl. No.: 17/369,479

(22) Filed: Jul. 7, 2021

(65) Prior Publication Data

US 2022/0020872 A1    Jan. 20, 2022

Related U.S. Application Data

(60) Provisional application No. 63/052,075, filed on Jul. 15, 2020, provisional application No. 63/052,096, filed on Jul. 15, 2020.

(51) Int. Cl.
| | |
|---|---|
| *H01L 29/778* | (2006.01) |
| *G01R 19/00* | (2006.01) |
| *G01R 31/26* | (2020.01) |
| *H01L 29/20* | (2006.01) |

(52) U.S. Cl.
CPC ...... *H01L 29/7786* (2013.01); *G01R 19/0092* (2013.01); *G01R 31/2621* (2013.01); *H01L 29/2003* (2013.01)

(58) Field of Classification Search
CPC ............. H01L 29/2003; H01L 29/7815; H01L 29/778–7789; G01R 19/0092
See application file for complete search history.

(56) References Cited

U.S. PATENT DOCUMENTS

| | | | | |
|---|---|---|---|---|
| 5,027,251 | A  * | 6/1991 | Hirota | H01L 29/7815 361/111 |
| 10,818,786 | B1 * | 10/2020 | Udrea | H01L 27/0883 |
| 2011/0193171 | A1 * | 8/2011 | Yamagiwa | H01L 29/861 257/355 |
| 2013/0248931 | A1 * | 9/2013 | Saito | H01L 21/8252 257/E29.246 |
| 2014/0217495 | A1 * | 8/2014 | Wutte | H01L 29/7811 438/652 |

(Continued)

OTHER PUBLICATIONS

"A 600 V GaN-on-Si Power IC with Integrated Gate Driver, Freewheeling Diode, Temperature and Current Sensors and Auxiliary Devices" to Stefan Moench et al. in CIPS 2020; 11th International Conference on Integrated Power Electronics Systems, available on IEEE on May 21, 2020 (Year: 2020).*

(Continued)

*Primary Examiner* — Eric A. Ward
(74) *Attorney, Agent, or Firm* — Robert F. Hightower

(57) ABSTRACT

In an embodiment, a HEMT is formed to have a main transistor having a main active area and a sense transistor having a sense active area. An embodiment may include that the main active area is isolated from the sense active area.

19 Claims, 6 Drawing Sheets

(56) References Cited

U.S. PATENT DOCUMENTS

| | | | |
|---|---|---|---|
| 2016/0056138 A1* | 2/2016 | Shibib | H01L 27/0629 257/48 |
| 2016/0056150 A1* | 2/2016 | Nagai | H03K 17/0822 257/76 |
| 2016/0313378 A1* | 10/2016 | Duvjnak | G01R 19/10 |
| 2017/0093387 A1 | 3/2017 | Zhu et al. | |
| 2017/0117889 A1* | 4/2017 | Kim | H01L 29/778 |
| 2019/0341483 A1* | 11/2019 | Harada | G01R 19/10 |
| 2019/0341484 A1* | 11/2019 | Takeuchi | H01L 29/1095 |

OTHER PUBLICATIONS

Wei Jia Zhang et al., "An Integrated Gate Driver for E-mode GaN HEMTs with Active Clamping for Reverse Conduction Detection," Proceedings of the 31st International Symposium on Power Semiconductor Devices & ICs, May 19-23, 2019, Shanghai, China, IEEE 978-1-7281-0581-9/19, pp. 83-86.

ON Semiconductor, AND8093/D—Current Sensing Power MOSFETs, Application Note Rev. 6, Mar. 2017, 12 pages.

Mehrdad Biglarbegian et al., "Characterization of SenseGaN Current-Mirroring for Power GaN with the Virtual Grounding in a Boost Converter," IEEE 978-1-5090-2998-3/17, 2017, pp. 5915-5919.

Mehrdad Biglarbegian et al., "Development of Isolated SenseGaN Current Monitoring for Boundary Conduction Mode Control of Power Converters," IEEE 978-1-5386-1180-7/18, 2018, pp. 2725-2729.

M. S. Zaman et al., "Integrated SenseHEMT and Gate-Driver on a 650-V GaN-on-Si Platform Demonstrated in a Bridgeless Totem-pole PFC Converter,", Proceedings of the 2020 32nd International Symposium on Power Semiconductor Devices and ICs (ISPSD) Sep. 13-18, 2020, Vienna, Austria, IEEE 978-1-7281-4836-6/20, pp. 26-29.

Stefan Moench et al., "Integrated Current Sensing in GaN Power ICs," Proceedings of the 31st International Symposium on Power Semiconductor Devices & ICsMay 19-23, 2019, Shanghai, China, IEEE 78-1-7281-0581-9/19, pp. 111-114.

Efficient Power Conversion Corporation, Alejandro Pozo Ph.D. et al., Reliability Report—EPC eGaN® FETs Reliability Testing: Phase 10, www.epc-co.com, 2019, 12 pages.

Yue Wen et al., "A Dual-Mode Driver IC With Monolithic Negative Drive-Voltage Capability and Digital Current-Mode Controller for Depletion-Mode GaN HEMT," IEEE Transactions on Power Electronics, vol. 32, No. 1, Jan. 2017, pp. 423-432.

* cited by examiner

HIGH ELECTRON MOBILITY TRANSISTOR

PRIORITY CLAIM TO PRIOR PROVISIONAL FILING

This application claims priority to prior filed Provisional Application No. 63/052,075 entitled "Integrated Sensing Element in a HEMT Device" filed on Jul. 15, 2020, having a docket number of ONS04167L01US, and having common inventors Vleeschouwer et al., and also claims priority to prior filed Provisional Application No. 63/052,096 entitled "All-GaN Bridgeless Totem-pole PFC Converter with Integrated SenseHEMT and Gate-Driver" filed on Jul. 15, 2020, having a docket number of ONS04168L01US, and having common inventors Roig-Guitart et al., both of which are hereby incorporated herein by reference.

BACKGROUND

The present invention relates, in general, to electronics, and more particularly, to semiconductors, structures thereof, and methods of forming semiconductor devices.

In the past, the electronics industry utilized high electron mobility transistors (HEMTs) for various applications. Because of their higher switching frequency and higher breakdown voltages, HEMTs were used in a variety of applications such as power supplies and other applications. However, it was often difficult to accurately determine current flow through the HEMT. In some applications, a series current-sense resistor was used. For high current applications, these current-sense resistors resulted in increased system power loss.

For most applications, it was also important for the current-sensing element to accurately determine the current and to have the same temperature characteristics as the HEMT. The current-sense resistors usually did not have such a temperature characteristics. It was also desirable to integrate the current-sense element on the same semiconductor die as the HEMT.

Accordingly, it is desirable to have circuits and methods to accurately sense current flow through a HEMT, to have a current-sense element that has similar temperature characteristics as the HEMT, and/or have a current sense element that can be integrated on a semiconductor die with the HEMT.

Figure 1:
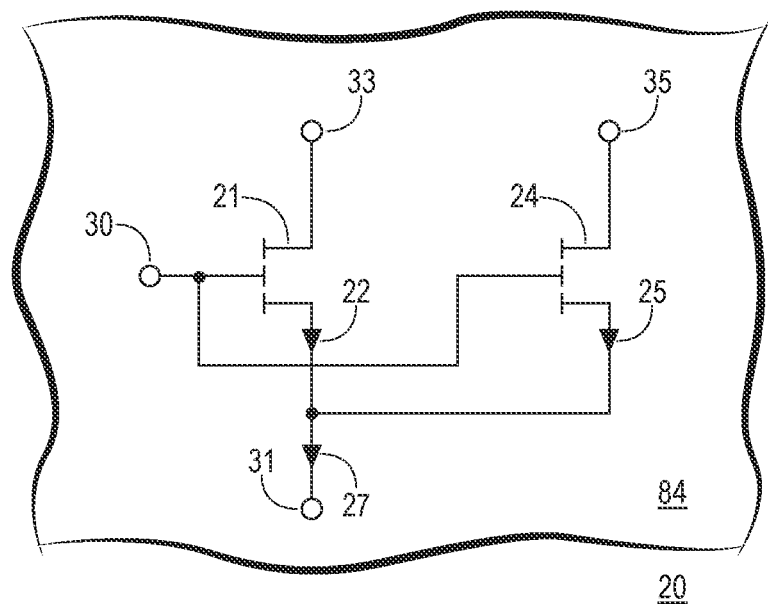
FIG. 1 schematically illustrates an example of a portion of an embodiment of a high electron mobility transistor (HEMT) in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of a transistor such as a MOS transistor or a high electron mobility transistor (HEMT), or an emitter or a collector of a bipolar transistor, or a cathode or anode of a diode, and a control element or control electrode means an element of the device that controls current through the device such as a gate of a MOS transistor, a gate of a HEMT, or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-type or P-type transistors, or as HEMTs or other HEM devices, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, conductivity type for HEMTs or other HEM devices refers to the conduction gas such as a two dimensional electron gas (2DEG) or a two dimensional hole gas (2DHG). It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for some elements including semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

The embodiments illustrated and described hereinafter may have embodiments and/or may be practiced in the absence of any element which is not specifically disclosed herein.

DETAILED DESCRIPTION OF THE DRAWINGS

FIG. 1 schematically illustrates an example of a portion of an embodiment of a high electron mobility transistor (HEMT) 20 that has more accurate current-sensing. Transistor 20 includes a main transistor 21 and a sense transistor 24 formed on a semiconductor substrate 84. As will be seen further hereinafter, sense transistor 24 has an embodiment that is configured to form a signal that accurately represents the value of current flowing through transistor 21. For example, an embodiment may include that a value of a current 25 through transistor 24 is proportional to the value of current 22 or alternately current 27. In an embodiment, transistors 20, 21, and 24 may be gallium nitride (GaN) transistors. For example, aluminum gallium nitride (AlGaN)/GaN transistors or indium gallium nitride (InGaN)/GaN transistors. Such transistor may be an enhancement mode transistor or alternately a depletion mode transistor. A source electrode of transistor 21 is electrically connected commonly to a source electrode of transistor 24 and to a source terminal or source conductor 31. A gate electrode of transistor 21 is commonly connected to a gate electrode of transistor 24 and to a gate terminal or gate conductor 30. A drain electrode of transistor 21 is connected to a drain terminal or drain conductor 33, and a drain electrode of transistor 24 is connected to a drain terminal or drain conductor 35. An embodiment of conductors 30-31, 33, and 35 may be a conductor that may be configured to couple transistor 20 to other elements on substrate 84 or to a circuit external to substrate 84.

Figure 2:
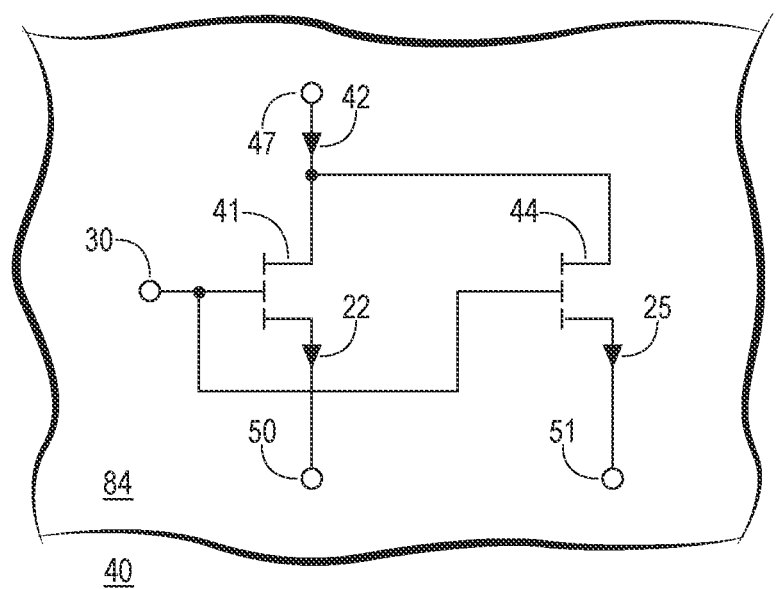
FIG. 2 schematically illustrates an example of a portion of an embodiment of another high electron mobility transistor (HEMT) that may be an alternate embodiment of the transistor of FIG. 1 in accordance with the present invention.

FIG. 2 schematically illustrates an example of a portion of an embodiment of a high electron mobility transistor (HEMT) 40 that may have an embodiment that may be substantially the same as transistor 20 but connected in a different configuration. Transistor 40 may be an alternate embodiment of transistor 20. Transistor 40 includes a main transistor 41 and a sense transistor 44. In an embodiment, transistors 40-41 and 44 may be gallium nitride (GaN) transistors, such as for example, an enhancement mode GaN transistor or alternately a depletion mode GaN transistor. An embodiment of transistors 41 and 44 may be substantially the same as respective transistors 21 and 24, except that they are connected in a different electrical configuration, such as for example having the drains commonly connected together instead of the commonly connected sources of transistor 20. An embodiment may include that a value of a current 25 through transistor 44 is proportional to the value of a current 22 through transistor 41, or alternately a current 42 through transistor 40, in the same manner as the proportionality explained for transistor 20. An embodiment may include that the amount of the proportionally may be different from that of transistor 20. A drain electrode of transistor 41 is electrically connected to a drain electrode of transistor 44 and to a drain terminal or drain conductor 47. A gate electrode of transistor 41 is connected to a gate electrode of transistor 44 and to gate conductor 30 (FIG. 2). A source electrode of transistor 41 is connected to a source terminal or source conductor 50, and a source electrode of transistor 44 is connected to a source terminal or source conductor 51. An embodiment of conductors 47 and 50-51 may be a conductor that connects transistor 40 to other elements on substrate 84 or to a circuit external to substrate 84.

Figure 3:
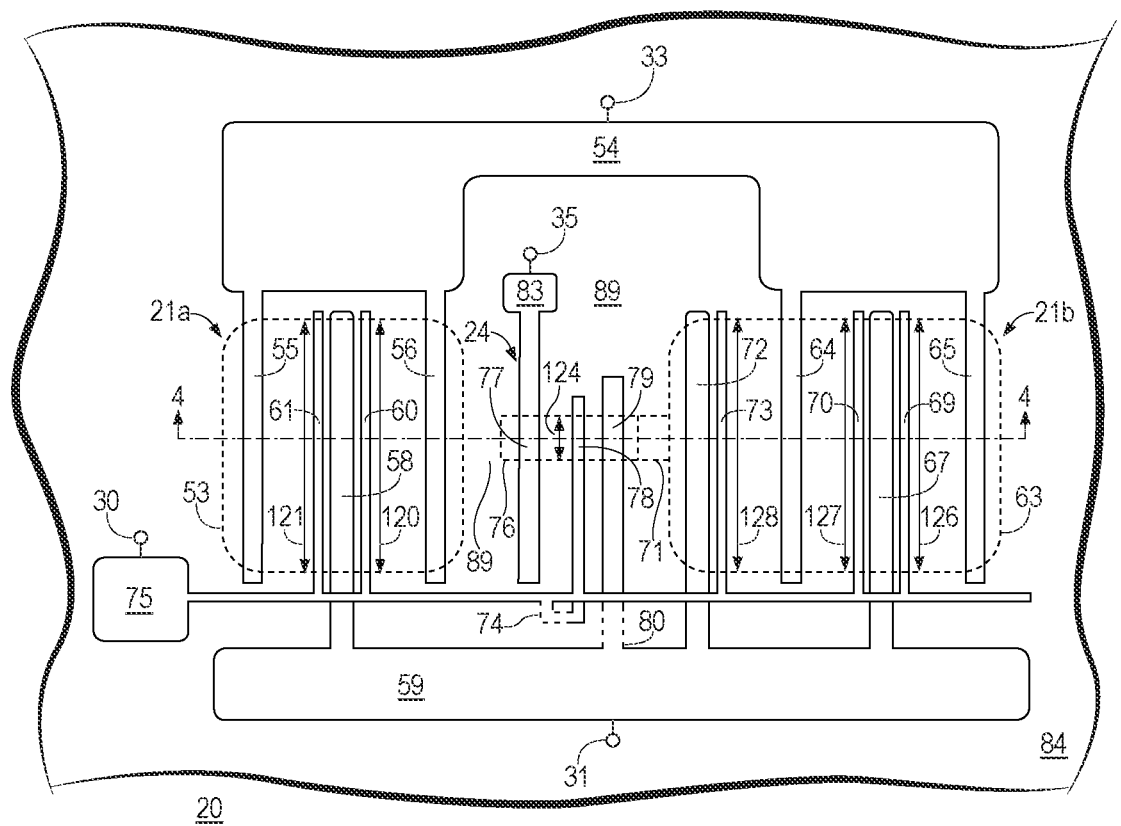
FIG. 3 illustrates an enlarged plan view of an example of a portion of an embodiment of the transistor of FIG. 1 in accordance with the present invention.

FIG. 3 illustrates an enlarged plan view of an example of a portion of an embodiment of transistor 20 formed on substrate 84. Transistor 24 has an active area 76 that is illustrated in a general manner by a dashed box. A sense source electrode or sense source 79 of transistor 24 is formed within active area 76. In an embodiment, sense source 79 is electrically connected to conductor 31 through a source connector 59 as illustrated by dashed lines 80. A sense drain electrode or sense drain 77 of transistor 24 is also formed within active area 76. Drain 77 is connected to drain conductor 35 through a drain connector 83. A gate structure or sense gate electrode or sense gate 78 is formed within active area 76. In an embodiment, sense gate 78 is connected to gate conductor 30 through a gate connector 75 as illustrated by dashed lines 74. An embodiment of either of sense source 79, sense drain 77, or sense gate 78 may be referred to or considered as an element or finger or branch. An embodiment of dashed lines 74 and 80 and connectors 59, 75, and 83 may be conductors such as a metal or other well-known conductor material. Although transistor 24 is illustrated to have one active area, more active areas may be used in other embodiments, and more than one gate, or source, or drain branch may be used in each active area. Examples of other numbers of active areas, or of other numbers of gates, sources, or drains therein are illustrated in FIGS. 5-8 and 11, any of which may be incorporated into this FIG. 3 and the description thereof by reference.

Transistor 21 includes a plurality of active areas that each include individual transistor elements (such as for example elements 21a and 21b) that function as individual transistors and that are electrically connected together to function as transistor 21. The plurality of active areas includes an active area 53 (illustrated by a dashed box) and an active area 63 (illustrated by a different dashed box). Although transistor 21 is illustrated to have two active areas, more or fewer active areas may be used in other embodiments. For example, active area 63 may be omitted in some embodiments. Active area 53 may include a plurality of main drain elements or fingers or branches including main drain electrodes or main drains 55 and 56 that may be formed therein. Either of main drains 55 or 56 may be referred to or considered as a drain element or finger or branch. Main drains 55 and 56 are connected to conductor 33 through a drain connector 54. A main source electrode or main source 58 of transistor 21 may be formed within active area 53 as a source element or finger or branch. Main source 58 is connected to conductor 31 through connector 59. Main gate structures or main gate electrodes or main gates 60 and 61 are formed within active area 53 and are connected to gate connector 75 and conductor 30. Within area 53, transistor 21 has one gate electrode for each drain electrode, but has fewer source electrodes than drain electrodes. Current to main source 58 can flow through substrate 84 from main drains 55 and 56, as controlled by respective main gates 60 and 61. In other embodiments, active area 53 may have more than one main source, and may have more or fewer main drains and gates.

Within active area 63, main drain electrodes or main drains 64 and 65 are formed as another plurality of main drain elements or fingers or branches. Main drains 64 and 65 are connected to connector 54, thus to conductor 33. A plurality of main source electrodes or main sources 67 and 72 are formed within active area 63 as a plurality of source elements or fingers or branches. Main sources 67 and 72 are connected to connector 59, thus to conductor 31. A plurality of main gate structures or main gate electrodes or main gates 69, 70, and 73 are formed within active area 63 as a plurality of gate elements or fingers or branches. Main gates 69, 70, and 73 are connected to connector 75, thus to conductor 30. Current from main source 67 can flow through substrate 84 to main drains 64 and 65, as controlled by respective main gates 70 and 69, and current from main source 72 can flow through substrate 84 to main drain 64, as controlled by main gate 73. In other embodiments, active area 63 may have more or fewer main drains or main gates or main sources.

In an embodiment, transistors 21 and 24 may be high voltage transistors that have a high source to drain breakdown voltage. Thus, the gate of each transistor may be closer to the source than to the drain. In other embodiments, transistors 21 and 24 may have different gate to drain spacings. An embodiment may include that the spacing between gate 78 and source 79 or the spacing between gate 78 and drain 77 may be substantially the same as the spacing of corresponding elements in area 53 or area 63.

Figure 4:
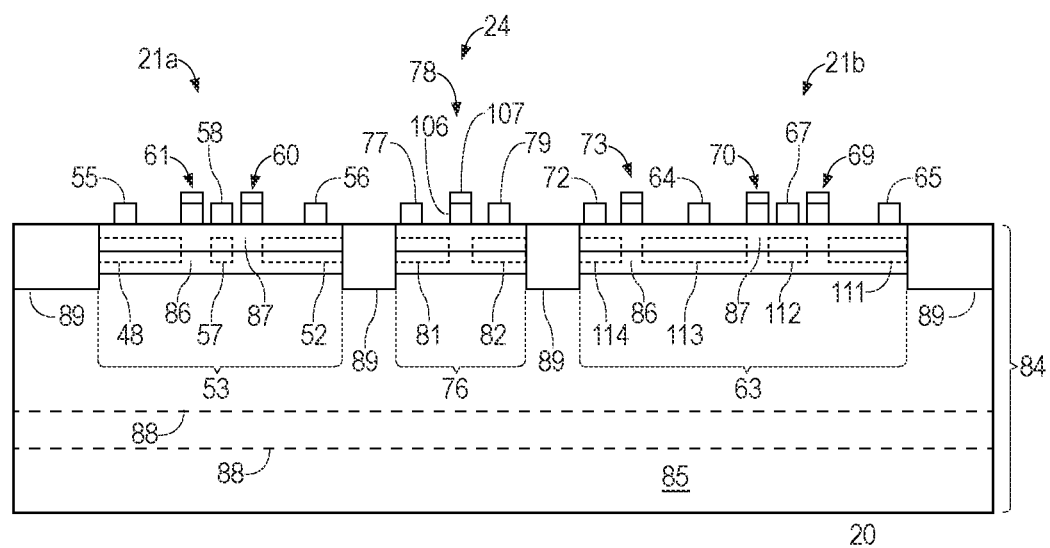
FIG. 4 illustrates an enlarged cross-sectional view of an example of a portion of an embodiment of the transistor of FIG. 3 in accordance with the present invention.

FIG. 4 illustrates an enlarged cross-sectional view of an example of a portion of an embodiment of transistor 20 along cross-section line 4-4 of FIG. 3. Transistor 20 is formed on substrate 84. Substrate 84 may include a bulk substrate 85 that has one or more layers, illustrated in general by dashed lines 88, formed on substrate 85 to provide stress relief or other material characteristics. For example, substrate 85 may be a silicon substrate that has buffer layers formed thereon to provide stress relief for layers of group III-V materials that may be formed as a part of substrate 84. Substrate 85 may also have embodiments of a GaN substrate, or a silicon carbide (SiC) substrate, or an aluminum nitride (AlN) substrate, or the like. An embodiment of substrate 84 may also include a gallium nitride (GaN) layer 86 and an aluminum gallium nitride (AlGaN) 87 formed on layer 86. Layers 86 and 87 form a two dimensional electron gas (2DEG) that is used to facilitate current flow through transistor 20.

An isolation region or isolation 89 is formed surrounding active area 76 and surrounding active areas 53 and 63. Isolation 89 isolates active area 76 from each of areas 53 and 63. Isolation 89 substantially prevents current flow from area 76 through substrate 84 to areas 53 and 63 (and to transistor 21 formed therein) and to other elements formed on substrate 84. For example, in FIG. 3, isolation 89 may surround all of the dashed lines of area 76 and all of the dashed lines of areas 53 and 63. An embodiment of isolation 89 may extend from the dashed lines of area 76 out past the ends of sense drain 77, sense gate 78, and sense source 79, or alternately extend up to connectors 54, 59, and 83, or alternately extend past connectors 54, 59, and 75. An embodiment of isolation 89 may also extend from the dashed lines of areas 53 and 63 out past the ends of main drains 55-56 and 64-65, past the ends of main sources 58, 67, and 72, and past the ends of main gates 60-61, 69-70, and 73. In an embodiment, isolation 89 may be formed by implanting nitrogen or other materials into substrate 84 in order to prevent formation of the 2DEG in regions external to active area 76 and external to active areas 53 and 63.

For transistor 24 and active area 76, sense drain 77, sense gate 78, and sense source 79 are formed on substrate 84. Sense gate 78 is positioned laterally between sense drain 77 and sense source 79 in order to the control current flow between the drain and source of transistor 24. An embodiment of sense gate 78 may be formed to include a P-type gallium nitride (GaN) material 106 formed on substrate 84 with a conductor 107 formed on material 106. Under the condition of substantially zero bias on conductor 107, sense gate 78 inhibits the formation of the 2DEG underlying sense gate 78. Sense gate 78 may have other embodiments as long as it prevents formation of the 2DEG underlying sense gate 78 under the condition of substantially zero bias on conductor 107. Thus, a sense drain 2DEG 81 is formed underlying sense drain 77 and extending across substrate 84 to a point that is underlying the edge of (or just prior to the edge of) sense gate 78. For example, the edge facing sense drain 77. Similarly, a sense source 2DEG 82 is formed underlying sense source 79 and extending across substrate 84 toward or up to a point that is underlying a different edge of (or just prior to the different edge of) sense gate 78. For example, the edge facing sense source 79.

Within active area 53, transistor 21 has main drains 55 and 56 formed on substrate 84. Main source 58 is formed within area 53 on substrate 84, and positioned laterally between main drains 55 and 56. Main gates 60 and 61 are formed within area 53 on substrate 84, and positioned between main source 58 and respective main drains 56 and 55. Main gates 60 and 61 are positioned on opposite sides of main source 58 in order to control current flow between the source and drains within area 53. In an embodiment, each of main gates 60 and 61 may be formed substantially the same as sense gate 78. Main gates 60 and 61 inhibit the formation of the 2DEG underlying main gates 60 and 61. Thus, a drain 2DEG 48 is formed underlying main drain 55 and extending across substrate 84 to a point that is underlying an edge (or just prior to the edge) of main gate 61. Similarly, another drain 2DEG 52 is formed underlying main drain 56 and extending across substrate 84 to a point that is underlying an edge (or just prior to the edge) of main gate 60. A source 2DEG 57 is formed underlying main source 58 and extending across substrate 84 toward both of main gates 60 and 61 up to a point that is underlying a different edge (or just prior to the different edge) of main gates 60 and 61. Isolation 89 isolates 2DEGs 48, 52, and 57 from 2DEGs 81-82.

In active area 63, transistor 21 also has drain, source, and gate electrodes formed therein. Main source 67 is formed on substrate 84 with main gates 69 and 70 on opposite sides of main source 67. Main drain 65 is formed adjacent main gate 69 such that main gate 69 is positioned between main drain 65 and main source 67. Main drain 64 is formed adjacent main gate 70 such that main gate 70 is positioned between main drain 64 and main source 67 to control current flow from main source 67 to main drain 64. Main gate 73 is formed adjacent an opposite side of main drain 64 and main source 72 is adjacent an opposite side of main gate 73 such that main gate 73 is positioned laterally between main drain 64 and main source 72 to control current flow from main source 72 to main drain 64. Main gates 69, 70, and 73 may be formed similar to sense gate 78. Main gates 69, 70, and 73 inhibit the formation of the 2DEG underlying these electrodes. Thus, a drain 2DEG 111 is formed underlying main drain 65 and extending across substrate 84 to underlie an edge (or alternately up to a point just prior to the edge) of main gate 69 that faces main drain 65. A source 2DEG 112 is formed underlying main source 67 and extends laterally away from main source 67 toward both of main gates 69 and 70 to the edges (or alternately up to a point just prior to the edges) of main gates 69 and 70. A drain 2DEG 113 is formed underlying main drain 64 and extends laterally across substrate 84 toward both of main gates 70 and 73 to the edges (or alternately up to a point just prior to the edges) of main gates 70 and 73 that face main drain 64. Another source 2DEG 114 is formed underlying main source 72 and extends across substrate 84 toward main gate 73 to an edge (or alternately up to a point just prior to an edge) of main gate 73 that faces main source 72. Isolation 89 isolates 2DEGs 111-114 from 2DEGs 81-82 and from 2DEGs 48, 52, and 57. Thus, each of active areas 53, 63, and 76 are isolated from each other.

Transistors 21 and 24 may have a plurality of sources, gates, and/or drains in each of areas 53, 63, and 76. One active area may have more gates or sources or drains than different one of the active areas.

Referring to FIGS. 1-4, in operation a voltage may be applied to sense gate 78 and main gates 60-61, 69-70 and 73 to form a conduction channel to allow current flow between 2DEGs 81-82, between 2DEG 57 and 2DEGs 48 and 52, between 2DEG 112 and 2DEGs 111 and 113, and between 2DEG 114 and 2DEG 113. Current 22 (FIGS. 1-2) through 2DEGs 48 and 52 from 2DEG 57, 2DEG 112 from 2DEGs 111 and 113, and 2DEG 114 from 2DEG 113 is proportional to current 25 (FIGS. 1-2) between 2DEGs 81-82. In an embodiment, current 22 is proportional to current 25 by a factor K. In an embodiment current 22 (I22) may be factor K times current 25 (I25), or I22=K*I25. An embodiment of transistors 20 and 40 may include that factor K is the total width of all main gates of transistor 21 (or transistor 41) divided by the total width of all sense gates of transistor 24 (or transistor 44). The width of each gate (main or sense) is the distance of the gate that is perpendicular to the flow of current in the corresponding active area from the drain to the source. For example, the width of sense gate 78 is illustrated in a general manner by an arrow 124, the width of main gates 60 and 61 is illustrated in a general manner by respective arrows 120-121, the width of main gates 69-70 is illustrated by respective arrows 126-127, and the width of main gate 73 is illustrated by arrow 128. In an embodiment, the width of the gate is the distance the gate extends through the active area in which the gate is formed. Thus, in active area 76 the gate width is smaller than the gate width in active areas 53 and 63 because active area 76 is smaller than either of active areas 53 and 63. Thus, the value of current 25 may be used to represent the value, including the temperature variations, of current 22. Since current 25 is smaller than current 22, sensing the value of current 25 uses less power than trying to directly measure current 22. Additionally, currents 22 and 25 have the same temperature characteristics because they formed physically near each other on the same semiconductor substrate.

In an embodiment, the widths of sense gate 78 and main gates 60-61, 69-70 and 73 are configured to form an on-resistance for transistor 21 that is less than the on-resistance of transistor 24. An embodiment may include forming the on-resistance (R24) of transistor 24 to be approximately the proportionality K times the on-resistance (R21) of transistor 21 (R24=K*R21). The value of factor K may be between approximately one hundred (100) and approximately one hundred thousand (100,000) and in an embodiment may be greater than approximately twenty five thousand (25,000).

As explained further hereinafter in the description of FIG. 8, an embodiment of transistor 20 may optionally include that active area 76, or elements within active area 76, may be shared with one or more of active areas 53 or 63. For example, active area 76 may be formed to intersect or overlap a portion of active area 63 as illustrated by dashed lines 71. For such an embodiment, the portion of isolation 89 that is between active areas 76 and 63 would be omitted. Additionally, sense source 79 may be omitted and main source 72 may function as both a main source of transistor 21 and a sense source of transistor 24. The proportionality factor K would remain unchanged because the width of sense gate 78 is unchanged. Also as explained in the description of FIG. 8, an embodiment of transistor 20 may be include that the width of any of the sense gates may be formed to be less than or shorter than the width of any of the main gates. This assists in providing a usable value for the proportionality factor K. For example, this may assist in providing a larger value for the proportionality factor K.

Figure 5:
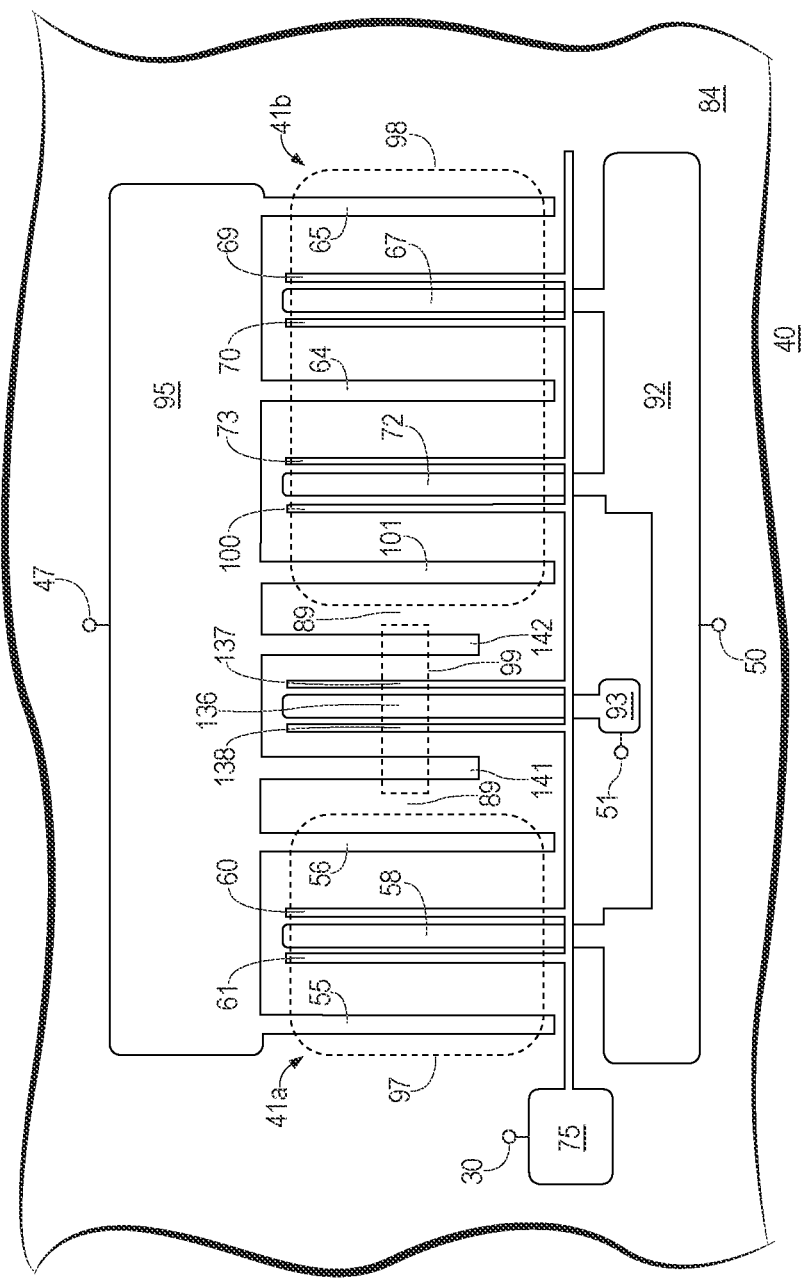
FIG. 5 illustrates an enlarged plan view of an example of a portion of an embodiment of the transistor of FIG. 2 in accordance with the present invention.

FIG. 5 illustrates an enlarged plan view of an example of a portion of an embodiment of transistor 40 formed on substrate 84. Sense transistor 44 has an active area 99 that is illustrated in a general manner by a dashed box. Active area 99 has more sense gates and sense drains than active area 76 (FIG. 3). A sense source electrode or sense source 136 is formed within active area 99 and is electrically connected to conductor 51 through a sense source connector 93. A plurality of sense drain electrodes or sense drains 141 and 142 are also formed within active area 99. Sense drains 141 and 142 are connected to drain conductor 47 through a drain connector 95. In an embodiment, sense drain 141 may be substantially the same as sense drain 77 (FIG. 3), except for the connection to connector 83. Sense gate structures or sense gate electrodes or sense gates 138 and 139 are formed within active area 99 and are connected to gate conductor 30 through gate connector 75. An embodiment of connectors 93 and 95 may be conductors such as a metal or other well-known conductor material. An embodiment of active area 99 may be substantially the same as area 76 (FIG. 3) except that area 99 includes sense source 136 connected to conductor 51 and also includes sense gate 138 and multiple drain fingers or branches including additional sense drain 141.

Transistor 41 includes a plurality of active areas that each include individual transistor elements (such as for example elements 41a and 41b) that function as individual transistors and that are electrically connected together, similarly to elements 21a and 21b (FIG. 3), to function as transistor 41. The plurality of active areas includes an active area 97 (illustrated by a dashed box) and an active area 98 (illustrated by a different dashed box). Although transistor 41 is illustrated to have two active areas, more or fewer active areas may be used in other embodiments. Main drains 55 and 56, main source 58, and main gates 60 and 61 are formed within active area 97. Area 97 is substantially the same as area 53 (FIG. 3) except that main drains 55 and 56 are connected to connector 95, and main source 58 is connected to conductor 50 through a connector 92.

Within active area 98, transistor 41 has main drains 64 and 65, main sources 67 and 72, and main gates 69, 70, and 73 similar to active area 63 (FIG. 3). However, active area 98 also includes an additional main drain 101 and an additional main gate 100. Main gate 100 is formed substantially the same as main gate 73 except that main gate 100 is on an opposite side of main source 72. Main gate 100 is positioned between main source 72 and main drain 101. In operation, transistor 40 operates similarly to transistor 20, however the factor K has a different value because it includes the width of additional sense gate 138 and additional main gate 100. Additionally, the widths of sense gates 137 and 138 and main gates 60-61, 69-70, 73, and 100 are configured to form an on-resistance for transistor 41 that is less than the on-resistance of transistor 44. An embodiment may include forming the on-resistance (R44) of transistor 44 to be approximately the proportionality K times the on-resistance (R41) of transistor 41 (R44=K*R41).

As explained further hereinafter in the description of FIG. 8, an embodiment of transistor 40 may optionally include that active area 99, or elements within active area 99, may be shared with one or more of active areas 97 or 98. For example, active area 99 may be formed to extend toward either of active areas 97 or 98 and to intersect or overlap a portion of either of active areas 97 or 98. For such an embodiment, the portion of isolation 89 that is between active areas 99 and the one or more of active areas 97 or 98 with which active area 99 intersects would be omitted. Additionally, the one or more of sense drains 141 or 142 that is closest to the intersection would be omitted and the respective one or more of main drains 56 or 101 may function as the drain for both transistors 41 and 44. The proportionality factor K would remain unchanged because the width of sense gate 137 and 138 are unchanged. Also as explained in the description of FIG. 8, an embodiment of transistor 40 may include that the width of any of the sense gates may be formed to be less than or shorter than the width of any of the main gates. This assists in providing a usable value for the proportionality factor K. For example, this may assist in providing a larger value for the proportionality factor K.

Figure 6:
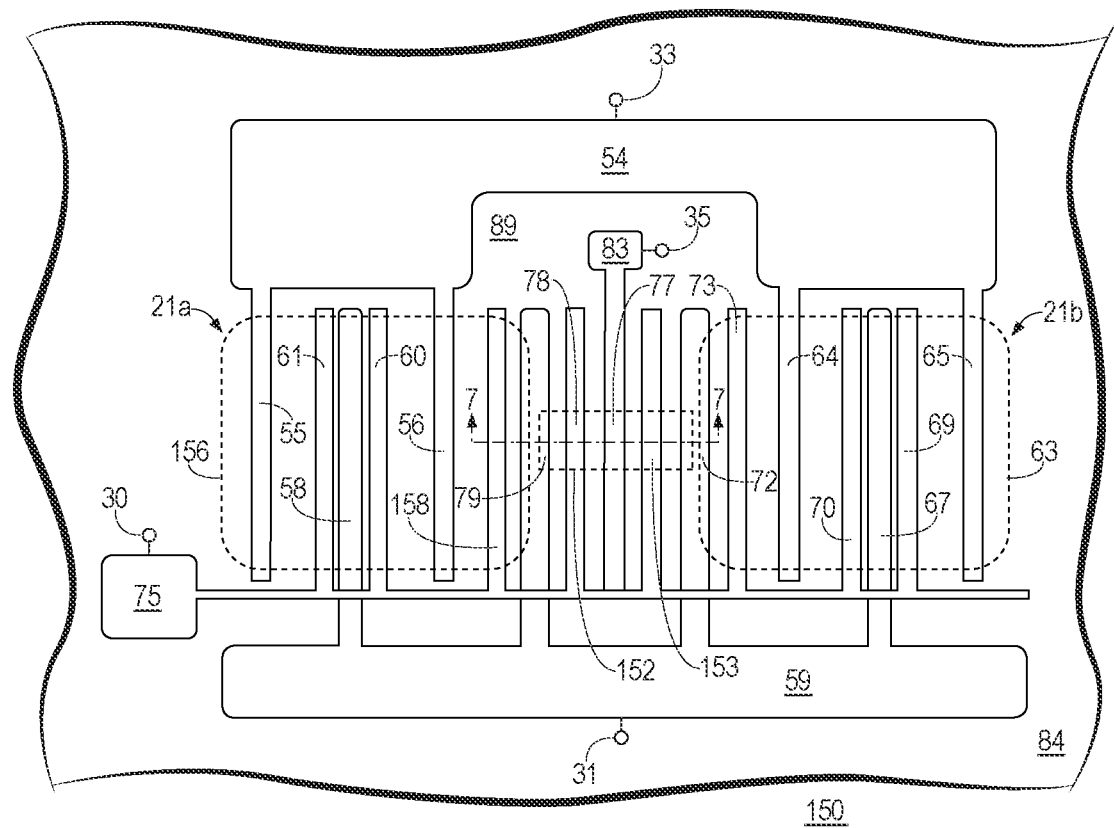
FIG. 6 illustrates an enlarged plan view of an example of a portion of an embodiment of another transistor that may be an alternate embodiment of the transistors of FIG. 1 or FIG. 2 in accordance with the present invention.

FIG. 6 illustrates an enlarged plan view of an example of a portion of an embodiment of a transistor 150 that may have an embodiment that may be an alternate embodiment of transistors 20 or 40 (FIGS. 1-2). Transistor 150 has the same circuit electrical configuration as transistor 20. However, sense transistor 24 of transistor 150 has an active area 152 that is an alternate embodiment of active area 76 (FIG. 3), and main transistor 21 has an active area 156 that is an alternate embodiment of active area 53 (FIG. 3). An embodiment of main transistor 21 may also include active area 63.

Active area 152 of sense transistor 24 includes an additional sense gate 153. Additionally, active area 152 is formed to overlap a portion of the material used for main source 72 that is formed within active area 63. The portion of the material of main source 72 that is within active area 152 forms a source electrode for transistor 24. Thus, the material of main source 72 is shared between sense transistor 24 and main transistor 21. The shared configuration forms an electrical connection between the source of transistor 24 and the source of transistor 21.

Active area 156 of main transistor 21 includes an additional main gate 158. Additionally, active area 156 is formed to overlap a portion of the material used for sense source 79 that is formed in active area 152. Thus, the portion of the material of sense source 79 that is within active area 156 forms a source for active area 156. That portion of the material of sense source 79 is shared with transistor 21 in active area 156. The sharing of the material forms an electrical connection between the source of transistor 21 and the source of transistor 24. The sharing reduces the size of transistor 150, and alternately transistors 20 or 40. Isolation 89 isolates active area 152 from active areas 63 and 156.

Figure 7:
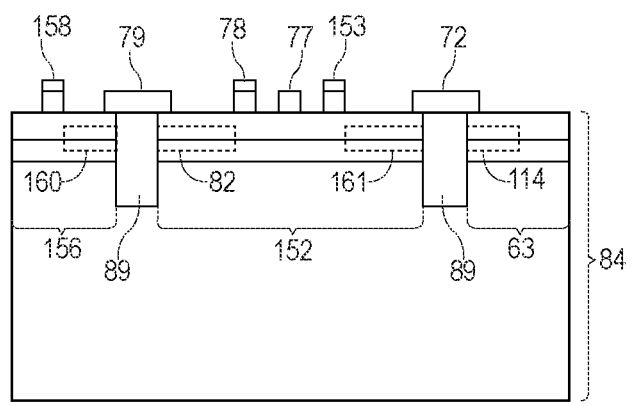
FIG. 7 illustrates an enlarged cross-sectional view of an example of a portion of an embodiment of the transistor of FIG. 6 in accordance with the present invention.

FIG. 7 illustrates an enlarged cross-sectional view of an example of a portion of an embodiment of transistor 150 along cross-section lines 7-7 of FIG. 6. This description has references to FIGS. 6-7. Isolation 89 is formed to underlie a portion of the material of sense source 79 that is shared between active areas 152 and 156. Thus, 2DEG 82 (FIG. 4) is formed underlying the portion of the material of sense source 79 that is within active area 152 and extends to sense gate 78 as explained hereinbefore in the description of FIG. 4. Additionally, a main 2DEG 160 is formed underlying the portion of the material of sense source 79 that is within active area 156. 2DEG 160 is formed underlying the portion of the material of sense source 79 and extending across substrate 84 to the edge of main gate 158. Another portion of isolation 89 is formed underlying a portion of the material of main source 72 that is shared between active areas 63 and 152. Thus, source 2DEG 114 (FIG. 4) is formed underlying the portion of the material of main source 72 that is within active area 63 as explained hereinbefore of in the description of FIG. 4. A sense 2DEG 161 is formed underlying the portion of the material of main source 72 that is shared with active area 152. 2DEG 161 extends from underlying the material of main source 72 and extends across substrate 84 to an edge of sense gate 153.

In operation, sense transistor 24 can conduct current between sense drain 77 and the portion of the material of main source 72 that is within active area 152, as controlled by sense gate 153. Additionally, current can flow between sense drain 77 and the portion of the material of sense source 79 that is within active area 152, as controlled by sense gate 78. In active area 156, current can also flow between main drain 56 and the portion of the material of sense source 79 that is within active area 156, as controlled by main gate 158. In active area 63, current can flow between main drain 64 and the portion of the material of main source 72 that is within active area 63, as controlled by main gate 73. Thus, an embodiment may include that the material of electrodes of any of the transistors can be shared between any of the active areas as long as there is an isolation to separate the active areas.

Figure 8:
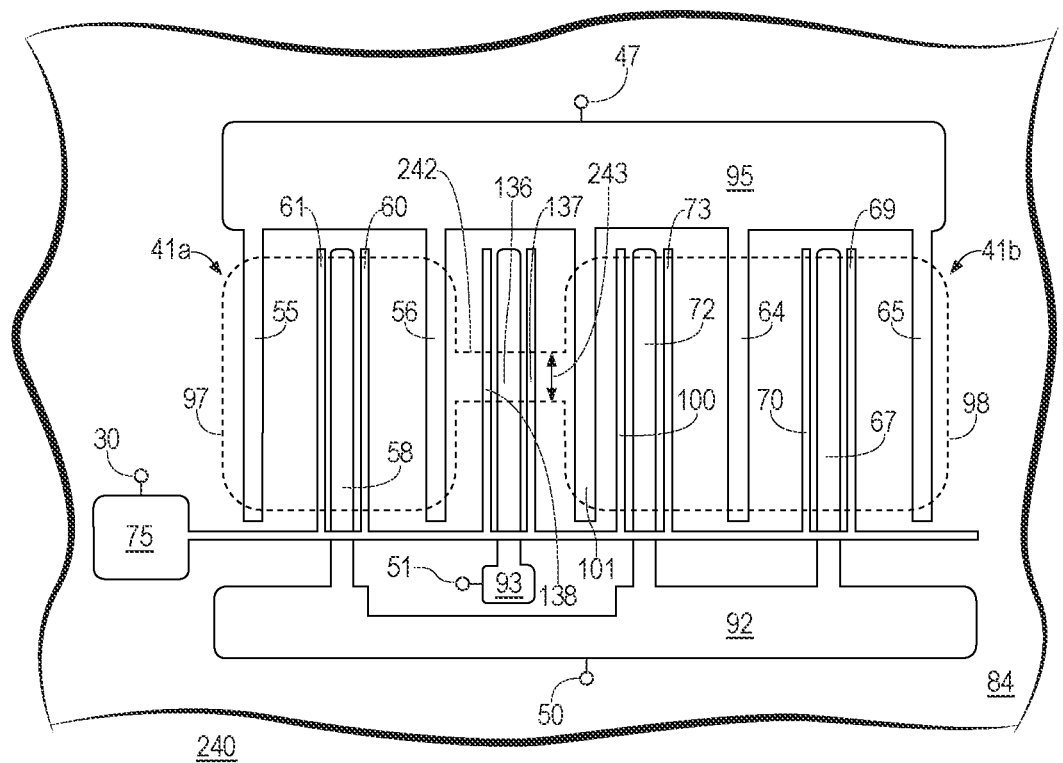
FIG. 8 illustrates an enlarged plan view of an example of a portion of an embodiment of a transistor that may have an embodiment that may be an alternate embodiment of one or more of the transistors of FIGS. 1-7.

FIG. 8 illustrates an enlarged plan view of an example of a portion of an embodiment of a transistor 240 that may have an embodiment that may be an alternate embodiment of transistors 20 or 40 (FIGS. 1-5). Transistor 240 includes transistors 41 and 44 (FIGS. 2 and 5) and has the same circuit electrical configuration as transistor 40. However, sense transistor 44 of transistor 240 has an active area 242 that is an alternate embodiment of active area 99 (FIG. 5). Active area 242 is shared with active areas 97 and 98 and elements with the active areas are also shared. Main drain 56 within active area 97 and main drain 101 within active area 98 are shared with active area 242. Thus, isolation 89 is omitted in the region that area 242 intersects with areas 97 and 98, but remains in areas external to areas 97, 98 and 242. Thus, area 242 intersects with areas 97 and 98, and isolation 89 does not separate active area 242 from active areas 97 and 98.

In operation, a portion of current 25 through sense source 136 flows from main drain 56 as controlled by sense gate 138, and the remainder of current 25 flows through sense source 136 from main drain 101 as controlled by sense gate 137. Sense gates 137 and 138 each have width 243 that is less than the width of any of main gates 60, 61, 69, 70, 73, and 100. The proportionality factor K is the sum of the widths of main gates 60, 61, 69, 70, 73, and 100 divided by the sum of the widths of gates 137 and 138. An embodiment may include that the width of either of sense gates 137 or 138 may be formed to be less than or shorter than the width of any one of main gates 60, 61, 69, 70, 73, and 100. In an embodiment, the sum of the widths of gates 137 plus 138 may be less than the sum of the widths of gates 60, 61, 69, 70, 73, and 100. Thus, even though drains 56 and 101 function as the main drains and also as the sense drains, current 22 is still proportional to current 25 by factor K (I22=K*I25). Thus, the on-resistance of transistor 44 (R44) is formed to be approximately the proportionality K times the on-resistance of transistor 41 (R41), (R44=K*R41).

Those skilled in the art will appreciate that active area 242 does not have to intersect with or overlap both of active areas 97 and 98. In other embodiments active area 242 may intersect only one of active areas 97 or 98 and only the corresponding sense drain may be omitted. In another embodiment, active area 76 (FIG. 3) of transistor 24 may be formed to overlap with or intersect with active area 53 in a manner similar to active area 242.

Figure 9:
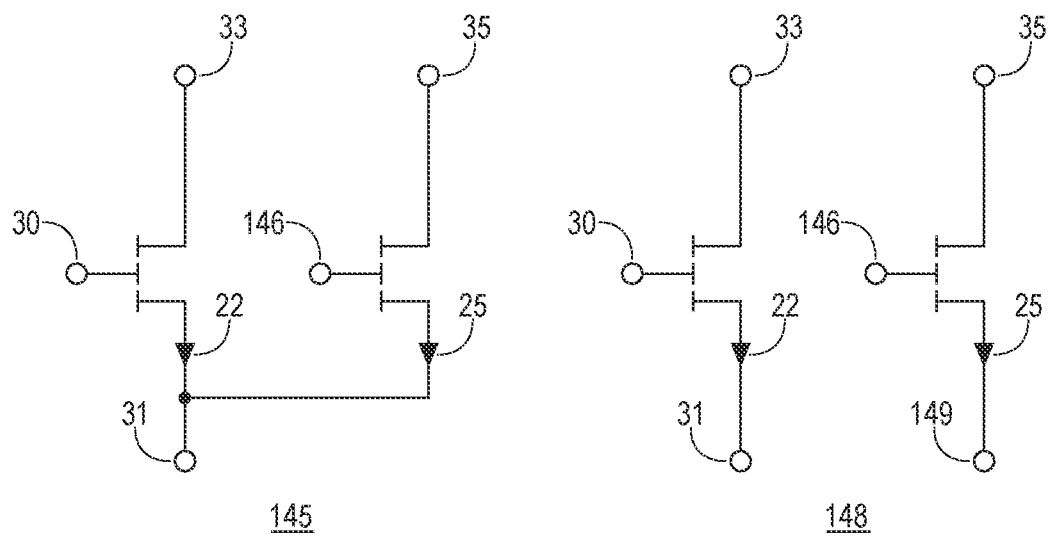
FIG. 9 schematically illustrates some examples of different electrical connections that can be used for either of the transistors of FIG. 1-2 or 6 in accordance with the present invention.

FIG. 9 schematically illustrates some examples of different electrical connections for transistors 20 or 40 (FIG. 1) or 150 (FIG. 6). An embodiment 145 illustrates that the electrical connections to the sense gates of transistor 20 (for example sense gate 78, FIG. 3) may be electrically separate from the main gates so that the sense gate may be operated separately. For example, the connection illustrated by dashed line 74 in FIG. 3 may be omitted so that gate 78 is electrically separate from the main gates. The temperature characteristics remain the same for the transistors, and under the condition of substantially the same gate voltages current 25 remains proportional to current 22 by the factor K.

An embodiment 148 illustrates transistor 20 having a separate electrical connection to the sense sources (for example source 79 of FIG. 3) using a sense source terminal 149. For example, the connection illustrated by dashed lines 80 (FIG. 3) may be omitted so that sense source 79 will have a separate electrical connection from main sources 58, 67, and 72. Current 25 is no longer proportional to current 22, however, the temperature characteristics or variations with temperature are the same for both currents 22 and 25.

Figure 10:
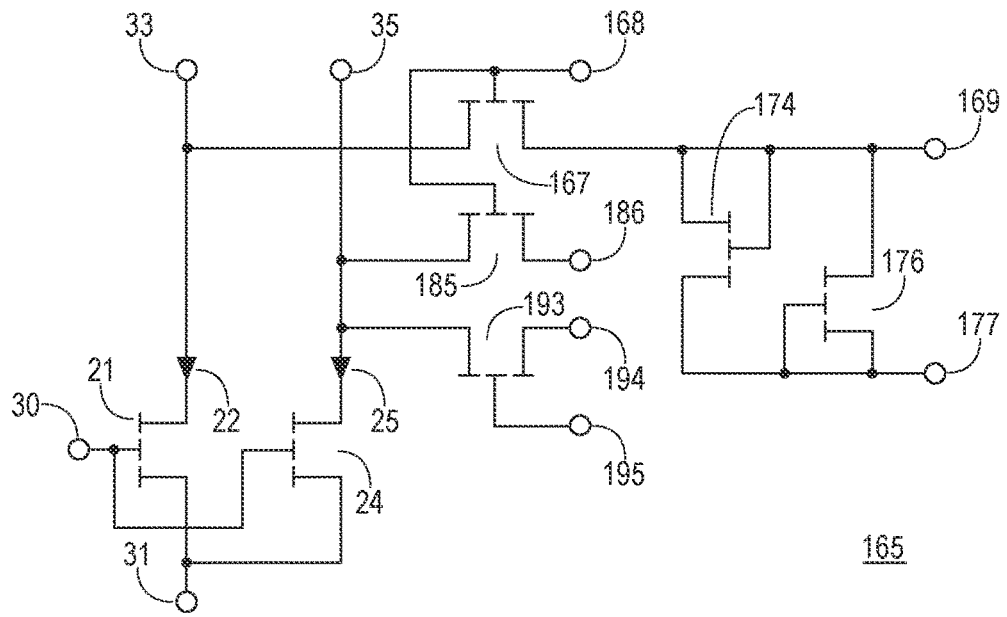
FIG. 10 schematically illustrates an example of a portion of an embodiment of a high electron mobility transistor (HEMI) that may have an embodiment that may be an alternate embodiment of any of the transistors of FIG. 1-2 or 6, 8 or 9 in accordance with the present invention.

FIG. 10 schematically illustrates an example of a portion of an embodiment of a high electron mobility transistor (HEMT) 165 that may have an embodiment that may be an alternate embodiment of any of transistors 20 or 40 (FIGS. 1-2), or transistor embodiments 145 or 148 (FIG. 9), or transistor 150 (FIG. 6). Transistor 165 includes a plurality of select switches or select transistors 167, 185, and 193 that are configured to couple either the main drain or the sense drain to outputs of transistor 165. Any of transistors 167, 185, and 193 may be optional and one or more may be omitted in some embodiments.

Transistor 167 is configured to selectively couple the drain of transistor 21 to an output 169 of transistor 165. Transistor 167 has a drain connected to the drain of transistor 21 and has a source connected to output 169. A gate of transistor 167 may be connected to a control terminal 168 to selectively control the operation of transistor 167. An embodiment of transistor 165 may include optional diode connected transistors 174 and 176 connected to output 169. A source of transistor 176 may be connected to the source of transistor 167 and to a drain and a gate of transistor 174. A source of transistor 174 may be connected to a drain and a gate of transistor 176 and optionally to an input 177 of transistor 165. Diode-connected transistors 174 and 176 may be configured to clamp output 169 to a voltage that is lower than the voltage that may be applied to the drain of transistor 21. Thus, an embodiment may include a reference voltage or clamp voltage connected to input 177. In some embodiments, one or more of outputs 186 and 194 may also include clamp diodes such as for example diode connected transistors 174 and 176.

Transistor 185 has a drain connected to the drain of transistor 24 to selectively couple the drain of transistor 24 to an output 186 of transistor 165. A source of transistor 185 is connected to an output 186. In an embodiment, a gate of transistor 185 may be connected to the gate of transistor 167 so that transistors 167 and 185 may be operated substantially synchronously. In other embodiments, the gate of transistor 185 may not be connected to the gate of transistor 167 so that transistors 167 and 185 may be operated separately. A drain of transistor 193 is connected to the drain of transistor 24 to selectively couple the drain of transistor 24 to an output 194 of transistor 165. A source of transistor 193 is connected to output 194 and a gate is connected to a control of terminal 195 so that transistor 193 may be operated independently of any other transistors of transistor 165.

Transistor 193 can be switched on and off separately from transistors 21 and 24 and from transistors 167 and 185. This ability allows transistor 193 to selectively couple a signal that is representative of current 22 to output 194. This isolates the circuitry connected to output 194 from transistor 24. Similarly, transistors 167 and 185 may be selectively enabled to couple signals representative of the signals from the drains of transistors 21 and 24 to circuitry on outputs 169 and 186. An embodiment of any one or more of transistors 167, 185, and 193 may be high voltage transistors that may be connected to other circuitry to assist in the other circuitry processing the signals from transistors 21 or 24.

Figure 11:
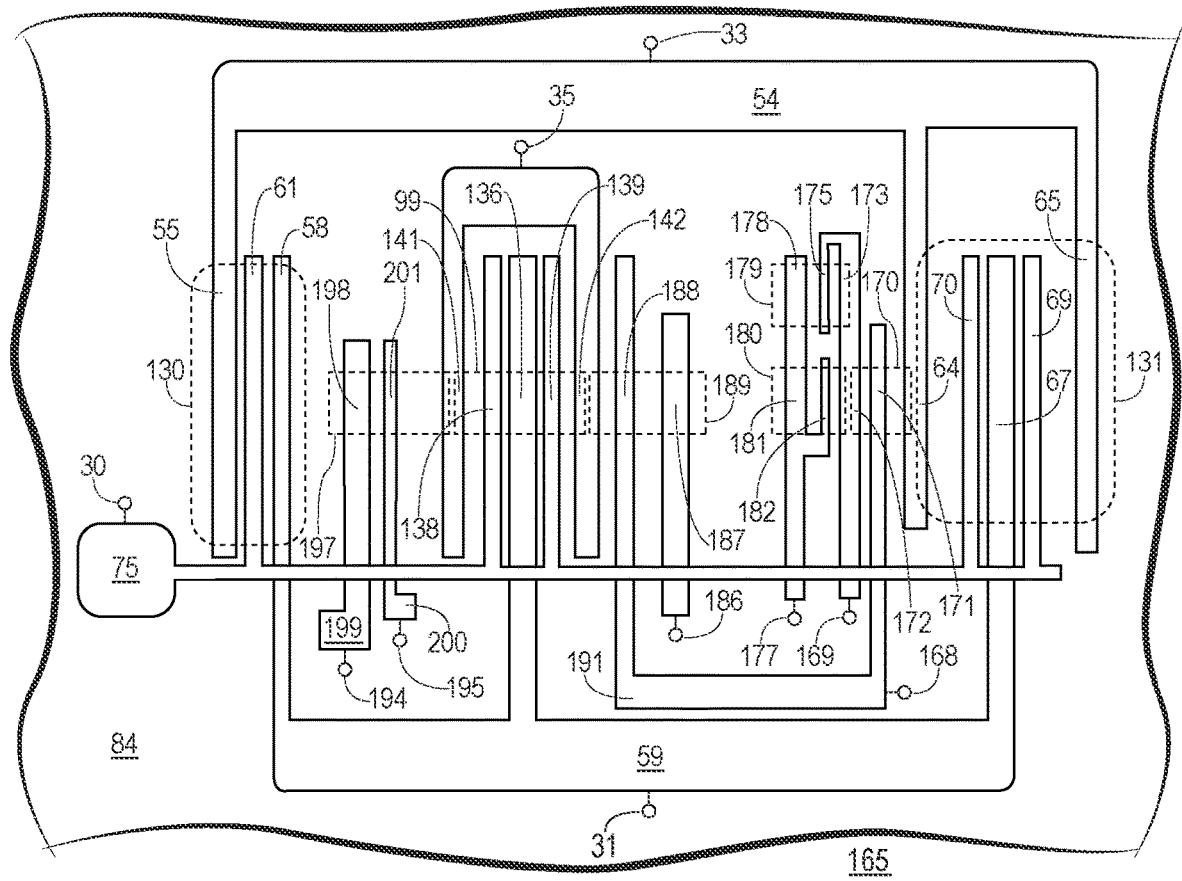
FIG. 11 illustrates an enlarged plan view of an example of a portion of an embodiment of the transistor of FIG. 10 in accordance with the present invention.

FIG. 11 illustrates an enlarged plan view of an example of a portion of an embodiment of transistor 165 formed on substrate 84. Those skilled in the art will appreciate that the active portion of the source, gate, and drain electrodes are within the corresponding active areas and that the reference numbers and lead lines may in some cases be external to the active areas for clarity of the drawings.

Main transistor 21 includes main active areas 130 and 131 (illustrated in general by dashed boxes) that may be alternate embodiments of respective active areas 53 and 63 of FIG. 3. Sense transistor 24 includes sense active area 99 (FIG. 5) along with corresponding sense source 136, sense gates 137 and 138, and sense drains 141-142 (FIG. 5).

Select transistor 193 has an active area 197. A source electrode 198 of transistor 193 is formed in active area 197 and a gate electrode 201 of transistor 193 is also formed in active area 197. Active area 197 extends to overlap a portion of the material of sense drain 141 such that sense drain 141 is shared with active areas 197 and 99. Thus, the drain of transistor 193 is electrically connected to the drain of transistor 24 (FIG. 10). A source electrode 198 of transistor 193 is connected to output 194 through a source connector 199, and gate electrode 201 is connected to terminal 195 through gate connector 202. In an alternate embodiment, active area 197 may be formed to overlap or intersect active area 99.

Transistor 185 has an active area 189. A source electrode 187 and a gate electrode 188 of transistor 185 are formed within active area 189. Active area 189 overlaps a portion of the material of sense drain 142 of transistor 24 such that the drain of transistor 185 is electrically connected to the drain of transistor 24. Gate electrode 188 is connected to a gate connector 191. In an alternate embodiment, active area 189 may be formed to overlap or intersect active area 99.

Transistor 167 has an active area 170. A source electrode 172 of transistor 167 is formed within active area 170. A gate electrode 171 of transistor 167 is formed within active area 170 and is connected to connector 191 and terminal 168. Active area 170 overlaps a portion of the material of main drain 64 within active area 131. Thus, the drain electrode of transistor 167 is electrically connected to the drain electrode of transistor 21. In an alternate embodiment, active area 170 may be formed to overlap or intersect active area 131.

Transistor 174 has an active area 179. A drain electrode 173 is formed in active area 179 as an extension of the material used for source electrode 172 so that drain electrode 173 is electrically connected to source electrode 172 of transistor 167. However, active area 179 is isolated from active area 170. A gate electrode 175 of transistor 174 is also formed within active area 179. The material used for drain electrode 173 extends to become gate electrode 175 that extends substantially parallel to electrode 173. Thus, gate electrode 175 is electrically connected to drain electrode 173. A source electrode 178 of transistor 174 is also formed within active area 179.

Transistor 176 has an active area 180. A drain electrode 181 of transistor 176 is formed within active area 180. The material used for drain electrode 181 is an extension of the material used for source electrode 178. A gate electrode 182 of transistor 176 is also formed within active area 180. The material used for drain electrode 181 extends to form gate electrode 182 that extends substantially parallel to drain electrode 181 so that gate electrode 182 is electrically connected to drain electrode 181 and to source electrode 178. The material used for drain electrode 181 extends to connect to input 177. Active area 180 also overlaps a portion of the material used to form source electrode 172. This material now functions as a source of transistor 176. Thus, the source of transistor 176 is connected to the drain of transistor 174. In an alternate embodiment, active area 180 may be formed to overlap or intersect active area 170.

From all the foregoing, one skilled in the art will understand that an example of an embodiment of a SenseHEMT may comprise:

a GaN transistor having a main transistor and a sense transistor formed on a semiconductor substrate, such as for example substrate 84, the main transistor having a main active area, such as for example area 53 and/or 63, and the sense transistor having a sense active area, such as for example area 76;

an isolation structure that isolates the sense active area from the main active area;

a main drain, such as for example one of drains 55 or 56, of the main transistor formed within the main active area;

a sense drain of the sense transistor formed within the sense active area;

a sense gate of the sense transistor formed in the sense active area, the sense gate having a first width;

a main gate, such as for example one or more of gates 60 or 61, of the main transistor formed in the main active area, the main gate having a second width that is greater than the first width, the main gate connected to the sense gate;

a sense source of sense transistor formed in the sense active area; and a main source of the main transistor formed in the main active area wherein one of the main source is connected to the sense source or the main drain is connected to the sense drain.

An embodiment may include that the GaN transistor includes a plurality of main active areas, such as for example areas 53 or 63.

In an embodiment each main active area of the plurality of main active areas includes a main drain, such as for example drains 55 or 56, and a main source, such as for example source 58.

An embodiment may include that the main active area includes a plurality of main drain branches, such as for example branch 55 or 56.

The SenseHEMT may have an embodiment wherein the main active area includes a plurality of main gate branches, such as for example branches 60 or 61.

An embodiment may include that the main active area includes at least one main gate branch for each main drain.

In an embodiment a portion of the isolation structure underlies a portion of a drain conductor of the main drain.

Another embodiment may include that the portion of the isolation structure separates a main 2DEG of the main transistor from a sense 2DEG of the sense transistor.

An embodiment of the SenseHEMT may include that a portion of the isolation structure underlies a portion of a source conductor of the main source.

An embodiment may include a select switch formed in the sense active area and coupled to the sense drain, the select switch having a select gate formed in the sense active area and a select source formed in the sense active area and positioned between he select source and the sense drain.

In another embodiment the sense drain has a 2DEG extending through the semiconductor substrate from underlying the sense drain toward the select gate and extending from underlying the sense drain toward the sense gate.

Those skilled in the art will understand that an example of an embodiment of a method of forming a high electron mobility transistor (HEMT) may comprise:

forming a GaN transistor on a semiconductor substrate including forming a main portion, such as for example transistor 21, of the GaN transistor in a main active area, such as for example area 53 or 63, and forming a sense portion, such as for example transistor 24, of the GaN transistor in a sense active area, such as for example area 76;

forming an isolation region, such as for example isolation 89, separating the main active area from the sense active area;

forming a main gate, such as for example one or more of gates 60/61, in the main active area;

forming a main drain region, such as for example one or more of drains 55 or 56, in the main active area including forming a main drain 2DEG, such as for example 2DEG 48 or 52, underlying the main drain region and extending across the semiconductor substrate toward a point underlying a first edge of the main gate;

forming a main source region, such as for example source 58, in the main active area including forming a main source 2DEG, such as for example 2DEG 57, underlying the main source region and extending across the semiconductor substrate toward another point underlying a second edge of the main gate;

forming a sense gate, such as for example gate 78, within the sense active area; and forming a sense drain region, such as for example drain 77, and a sense source region, such as for example source 79, within the sense active area including forming a sense 2DEG, such as for example 2DEG 80 or 81, within the sense active area and extending through the semiconductor substrate from adjacent the sense gate to underlie one of the sense source region or the sense drain region.

The method may have an embodiment that may include forming the isolation region includes forming the isolation region to isolate the sense 2DEG from the main drain 2DEG and from the main source 2DEG.

An embodiment may include forming the main drain region includes forming a plurality of drain branches.

In an embodiment the method may include forming the main gate includes forming at least one gate branch for each drain branch of the plurality of drain branches.

An embodiment may include forming the isolation region includes forming the isolation region surrounding the sense active area.

Those skilled in the art will understand that an example of an embodiment of a high electron mobility transistor (HEMT) may comprise:

a main active area on a first portion of a semiconductor substrate, such as for example substrate 84;

a main source, a main gate, and a main drain formed in the main active area;

a sense active area on a second portion of the semiconductor substrate; and a sense gate formed in the sense active area wherein the sense active area overlaps a portion of the main active area and wherein one of the main drain or the main source receives current through a 2DEG that is controlled by the sense gate.

The transistor may have an embodiment wherein the main drain includes a plurality of drain branches formed within the main active area.

An embodiment may include a select transistor, such as for example one of transistor 185 or 193, formed in the sense active area, the select transistor coupled to a sense drain, such as for example the drain of transistor 24.

Another embodiment may include a select transistor, such as for example transistor 167, formed in a first active area that is adjacent to the main active area, the select transistor having a drain coupled to the main drain, such as for example the drain of transistor 21.

Those skilled in the art will understand that an example of an embodiment of a method of forming a high electron mobility transistor (HEMT) may comprise:

forming a GaN transistor on a semiconductor substrate including forming a main portion, such as for example transistor 21, of the GaN transistor in a main active area, such as for example area 53 or 63;

forming a main gate, such as for example gate 60 or 61, in the main active area;

forming a main drain, such as for example drain 55 or 56, in the main active area including forming a main drain 2DEG, such as for example 2DEG 48 or 52, underlying the main drain and extending across the semiconductor substrate toward a point underlying a first edge of the main gate;

forming a main source, such as for example source 58, in the main active area including forming a main source 2DEG, such as for example 2DEG 57, underlying the main source and extending across the semiconductor substrate toward another point underlying a second edge of the main gate;

forming a sense portion, such as for example at least a portion of transistor 24, of the GaN transistor in a sense active area, such as for example area 76;

forming a sense gate, such as for example gate 78, within the sense active area; and forming the sense active area to overlap with the main active area, such as for example area 242 and 97 or 98 (FIG. 8), wherein the sense gate controls current to flow from the sense active area to one of the main drain through the main drain 2DEG or to the main source through the main source 2DEG.

In view of all of the above, it is evident that a novel device and method is disclosed. Included, among other features, is forming a HEMT having a main transistor and a sense transistor formed on the same substrate but in different active areas. The sense transistor forms a signal that is proportional to current through the main transistor. Because the active areas of the main and sense transistors are formed adjacent to each other on the same substrate, the sense current very accurately represents the current through the main transistor. Forming the active area of the sense transistor between the active areas of the main transistor assists in further increasing the accurate temperature tracking of the sense current. In an embodiment, the two active areas can share a portion of the electrode material of the other active area, but the two active areas are separated by an isolation. Sharing the electrodes reduces the size of the transistor and reduces the costs, and additionally positions the active area of the sense transistor close to the active area of the main transistor thereby increasing the accuracy of the current-sensing. In other embodiments, the two active areas may intersect. Forming the active areas to intersect assists in improving the matching of at least the transistor current-sensing and temperature characteristics.

While the subject matter of the descriptions is described with specific preferred embodiments and example embodiments, the foregoing drawings and descriptions thereof depict only typical and non-limiting examples of embodiments of the subject matter and are not therefore to be considered to be limiting of its scope, it is evident that many alternatives and variations will be apparent to those skilled in the art. As will be appreciated by those skilled in the art, the example form of transistors 20, 40 145, 148, 150, and 165 are used as vehicles to explain some embodiments that may include the main and sense transistors. However, the subject matter is applicable to other transistor configurations.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A SenseHEMT comprising:
a GaN transistor having a main transistor and a sense transistor formed on a semiconductor substrate, the main transistor having a main active area and the sense transistor having a sense active area;
an isolation structure that isolates the sense active area from the main active area;
a main drain of the main transistor within the main active area;
a sense gate of the sense transistor in the sense active area, the sense gate having a first width;
a sense drain of the sense transistor in the sense active area;
a main gate of the main transistor in the main active area, the main gate having a second width that is greater than the first width, the main gate connected to the sense gate;
a sense source of the sense transistor in the sense active area; and
a main source of the main transistor in the main active area wherein one of the main source is connected to the sense source or the main drain is connected to the sense drain.

2. The SenseHEMT of claim 1 wherein the GaN transistor includes a plurality of main active areas.

3. The SenseHEMT of claim 2 wherein each sense active area is positioned laterally between two main active areas of the plurality of main active areas.

4. The SenseHEMT of claim 1 wherein the main active area includes a plurality of main drain branches.

5. The SenseHEMT of claim 4 wherein the main active area includes a plurality of main gate branches.

6. The SenseHEMT of claim 5 wherein the main active area includes at least one main gate branch for each main drain.

7. The SenseHEMT of claim 1 wherein a portion of the isolation structure underlies a portion of a drain conductor of the main drain.

8. The SenseHEMT of claim 7 wherein the portion of the isolation structure separates a main 2DEG of the main transistor from a sense 2DEG of the sense transistor.

9. The SenseHEMT of claim 1 wherein a portion of the isolation structure underlies a portion of a source conductor of the main source.

10. The SenseHEMT of claim 1 further including a select switch in the sense active area and coupled to the sense drain, the select switch having a select gate in the sense active area and a select source in the sense active area and positioned between the select source and the sense drain.

11. The SenseHEMT of claim 10 wherein the sense drain has a 2DEG extending through the semiconductor substrate from underlying the sense drain toward the select gate and extending from underlying the sense source toward the sense gate.

12. The SenseHEMT of claim 1 wherein the sense drain has substantially the first width.

13. A high electron mobility transistor (HEMT) comprising:
a GaN transistor on a semiconductor substrate including a main portion of the GaN transistor in a main active area and a sense portion of the GaN transistor in a sense active area;
an isolation region separating the main active area from the sense active area;
a main gate in the main active area;
a main drain region in the main active area wherein a main drain 2DEG underlies the main drain region and extends across the semiconductor substrate toward a point underlying a first edge of the main gate;
a main source region in the main active area wherein a main source 2DEG underlies the main source region and extends across the semiconductor substrate toward another point underlying a second edge of the main gate;
a sense gate within the sense active area; and
a sense drain region and a sense source region within the sense active area, wherein the sense active area includes a sense 2DEG that extends through the semiconductor substrate from adjacent the sense gate to underlie one of the sense source region or the sense drain region.

14. The high electron mobility transistor (HEMT) of claim 12 wherein the isolation region isolates the sense 2DEG from the main drain 2DEG and from the main source 2DEG.

15. The high electron mobility transistor (HEMT) of claim 12 wherein the main drain region includes a plurality of drain branches.

16. The high electron mobility transistor (HEMT) of claim 14 wherein the main gate includes at least one gate branch for each drain branch of the plurality of drain branches.

17. The high electron mobility transistor (HEMT) of claim 12 wherein the isolation region includes the isolation region surrounding the sense active area.

18. A high electron mobility transistor (HEMT) comprising:
a plurality of main active areas on a first portion of a semiconductor substrate;
a first main source, a first main gate, and a first main drain in a first main active area of the plurality of main active areas;
one or more sense active areas on a second portion of the semiconductor substrate;
an isolation region separating each main active area of the plurality of main active areas from each sense active area wherein each sense active area is positioned laterally between two main active areas of the plurality of main active areas;
a first sense gate in a first sense active area of the one or more sense active areas wherein one of the first main source or the first main drain overlaps the first sense active area and the first main active area; and
a select transistor in a first active area that is adjacent to the first main active area, the select transistor having a drain coupled to the first main drain.

19. The high electron mobility transistor of claim 18 wherein the one of the first main drain or the first main source overlies at least a portion of the isolation region.

* * * * *